United States Patent [19]

Pasch et al.

[11] Patent Number: 5,674,774
[45] Date of Patent: Oct. 7, 1997

[54] METHOD OF MAKING SELF-ALIGNED REMOTE POLYSILICON CONTACTS

[75] Inventors: Nicholas F. Pasch, Pacifica; Ashok Kapoor, Palo Alto; Richard D. Schinella, Saratoga, all of Calif.

[73] Assignee: LSI Logic Corporation, Milpitas, Calif.

[21] Appl. No.: 474,794

[22] Filed: Jun. 7, 1995

[51] Int. Cl.$^6$ ................................................. H01L 21/335
[52] U.S. Cl. ................ 437/41 SM; 437/44; 437/193; 437/200; 437/228 PL
[58] Field of Search .................. 437/40 GS, 41 SM, 437/228 POL, 191, 193, 200, 186, 44; 156/636.1

[56] References Cited

U.S. PATENT DOCUMENTS

| | | | |
|---|---|---|---|
| 4,688,314 | 8/1987 | Weinberg et al. | 437/56 |
| 4,879,258 | 11/1989 | Fisher | 437/225 |
| 5,055,427 | 10/1991 | Haskell | 437/203 |
| 5,079,180 | 1/1992 | Rodder et al. | 437/44 |
| 5,182,619 | 1/1993 | Pfiester | 257/382 |

OTHER PUBLICATIONS

Wolf, et al., Silicon Processing, vol. 1, 1986, Lattice Press, pp. 386–400.

*Primary Examiner*—T. N. Quach
*Attorney, Agent, or Firm*—Oppenheimer Poms Smith

[57] ABSTRACT

Remote electrical contacts for a semiconductor are produced by depositing a polysilicon layer over the entire surface of a semiconductor device and removing a portion of the polysilicon layer by chemi-mechanical polishing. The resulting structure is thereby provided with electrically isolated areas of polysilicon which constitute remote electrical contacts for the semiconductor device. The polysilicon layer or the isolated areas of polysilicon can be salicided to provide very low resistivity. Either the polysilicon layer or the salicide layer can be subjected to ion implantation to provide LDD regions.

16 Claims, 1 Drawing Sheet

METHOD OF MAKING SELF-ALIGNED REMOTE POLYSILICON CONTACTS

FIELD OF THE INVENTION

The present invention relates generally to semiconductor processing. In one of its more particular aspects the present invention relates to self-aligned remote polysilicon contacts. In another of its more particular aspects this invention relates to a method for providing such contacts.

BACKGROUND OF THE INVENTION

High density integrated circuits require extremely small semiconductor devices such as MOS (Metal Oxide Semiconductor) devices of which tens of thousands or hundreds of thousands may be present on a single chip, commonly in the sub-micron size range. MOS devices in the sub-micron are sometimes prone to electrical breakdown because of their minute dimensions. In an effort to circumvent this problem, LDD (Lightly Doped Drain) regions adjacent to source and drain regions in the semiconductor device have typically been provided. However, the use of LDD's has been only partially successful in reducing electrical breakdown problems in sub-micron range MOS devices. In addition, in FET's (Field Effect Transistors) several "short-channel" and "punch-through" related problems may arise with respect to the types of contacts that are conventionally used.

In fact, providing source and drain contacts in itself creates certain problems in FET design. Although remote contacts in FET's can be fabricated from polysilicon, the use of polysilicon requires its selective deposition upon only certain areas of the FET structure. If the polysilicon is deposited upon the oxide areas of the device, where it is not desired, it is almost impossible to remove. In attempting to selectively deposit polysilicon, the common use of photolithographic techniques to form polysilicon layers cannot always assure the necessary level of precision. Thus, in a typical FET, layers may overlap the gate region or other oxide regions of the transistor.

It would be advantageous to provide MOS devices in which the polysilicon contacts were precisely aligned. It would also be advantageous to provide such devices in which electrical breakdown was minimized.

Accordingly, it is a principal object of the present invention to provide polysilicon contacts in MOS structures such as FET's, in a manner that assures precise alignment of the contacts.

Another object of the present invention is to provide semiconductor structures in which electrical breakdown is reduced.

Another object of the invention is to provide a simple and convenient method for generating such aligned contacts.

Other objects and advantages of the present invention will become apparent in the course of the following detailed description and disclosure.

SUMMARY OF THE INVENTION

In accordance with the present invention, shallow source and drain contacts are produced by the steps of (1) depositing a polysilicon layer over the entire surface of a semiconductor device having source and drain regions, a gate, and oxide spacers which may also contain LDD regions, and (2) chemi-mechanically polishing the resulting polysilicon layer, the gate, and the oxide spacers to remove a portion of the polysilicon layer, along with portions of the gate, and the oxide spacers.

By applying a polysilicon layer overall and then using chemi-mechanical polishing to remove polysilicon from areas on the surface of the transistor where it is undesired, such as from the gate and oxide spacers, the polysilicon layer is converted into two or more remote contacts. Chemi-mechanical polishing also reduces the thickness of the polysilicon remaining on the surface of the transistor. The net result is the provision of ultra-shallow polysilicon contacts electrically isolated from one another. Since the polysilicon can be removed with any desired degree of precision by chemi-mechanical polishing, the problems associated with photolithographic processes are no longer present. As noted above photolithographic processing does not provide a sufficiently high degree of precision to provide the structures having sufficiently small dimensions. The present invention in effect achieves automatic alignment of ultra-shallow electrical contact regions with source and drain regions without adversely affecting the electrical isolation achieved by use of oxide spacers.

DESCRIPTION OF EXEMPLARY EMBODIMENTS

Figure 1:
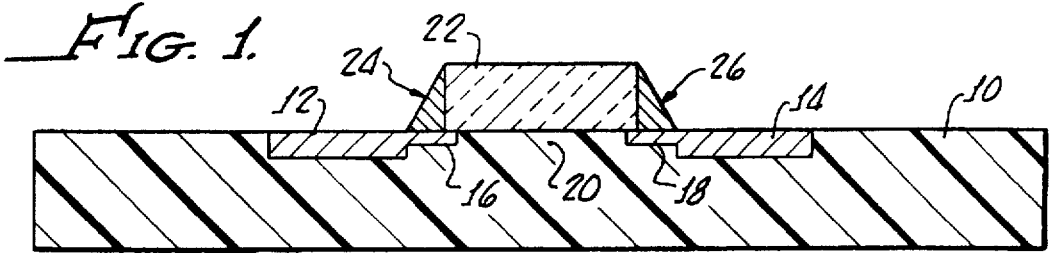
FIG. 1 is a fragmentary side section view of a FET structure containing source and drain regions, a gate and oxide spacers.

Referring to FIG. 1, a semiconductor substrate 10 is shown including a source region 12, a drain region 14, an LDD region 16 adjacent source region 12, and an LDD region 18 adjacent drain region 14. LDD regions 16 and 18 define a channel 20 over which is disposed a gate 22. An oxide spacer 24 isolates gate 22 from LDD region 16, and an oxide spacer 26 isolates gate 22 from LDD region 18.

Figure 2:
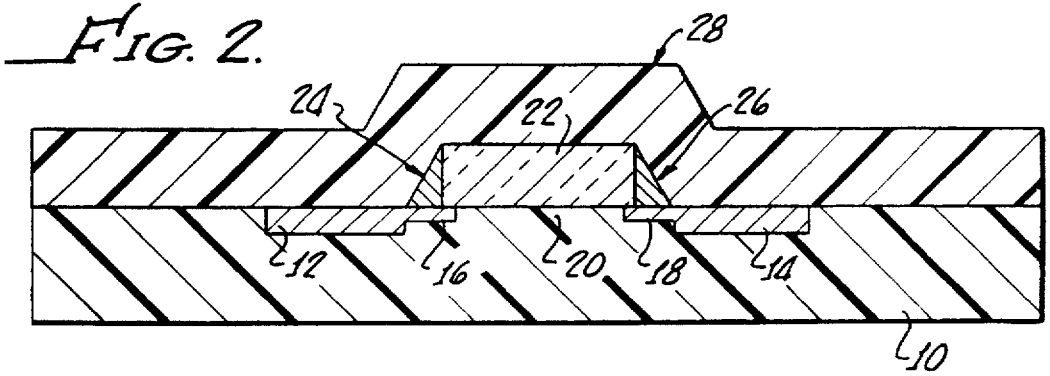
FIG. 2 is a fragmentary side section view of the structure of FIG. 1 after polysilicon deposition.

FIG. 2 shows the same features as FIG. 1 and, in addition, illustrates a polysilicon layer 28 deposited over the entire structure, including the gate, the oxide spacers and the source and drain regions.

Figure 3:
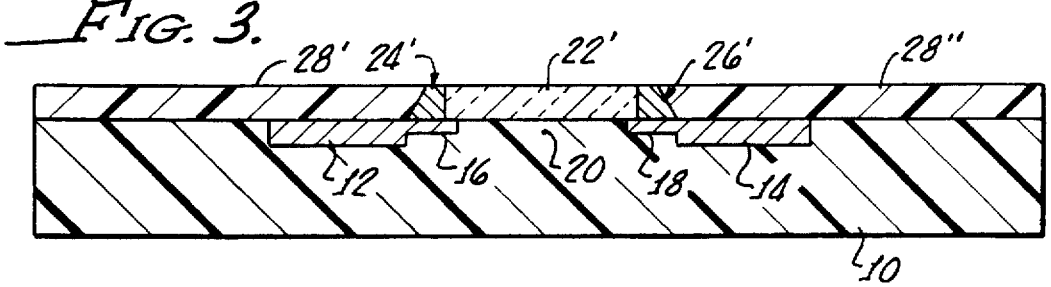
FIG. 3 is a fragmentary side section view of the structure of FIG. 2 after chemi-mechanical polishing.

FIG. 3 shows the results of chemi-mechanical polishing of the polysilicon coated structure of FIG. 2. A truncated gate 22', truncated oxide spacers 24' and 26', and reduced thickness polysilicon layers 28' and 28" result from the chemi-mechanical polishing. As can be seen from FIG. 3, the polysilicon layers 28' and 28", following chemi-mechanical polishing, are substantially thinner than the polysilicon layer of FIG. 2 and are electrically isolated from the truncated gate 22' by the truncated oxide spacers 24' and 26'. The isolated polysilicon layers now constitute electrical contacts for the source and drain regions of the FET that are electrically isolated from the truncated gate 22' by the oxide spacers 24' and 26'. The oxide spacers 24' and 26' were initially of a greater height than would eventually be required and could be polished to provide the requisite structure such that electrical isolation of the source, drain and gate regions of the FET is achieved. The oxide spacers, sometimes referred to as "LDD spacers", also functions both as an electrical isolation and, to a certain extent, as a polish stop material. The LDD spacers can be formed of silicon dioxide or other insulating material which is compatible with silicon device processing, such as silicon nitride. The oxide spacers are preferably formed after the LDD regions are formed by means of a low energy dose implantation to form the LDD channel. The source and drain regions are applied by high energy implantation following formation of the oxide spacers.

It has been determined that chemi-mechanical polishing can eliminate one of the most commonly encountered disadvantages of photolithographic processing. Typically photolithographic masking of polysilicon cannot register or align an area with sufficient precision to avoid negatively affecting the position of the channel in the FET. Chemi-mechanical polishing can be performed so as to reduce the thickness of the remote source and drain contacts to a range of about 2500 angstroms to 500 angstroms. An additional advantage of the present invention is that the reduction of the thickness of the remote contacts also reduces the capacitance of the FET, since the shallower the electrical contacts are the less capacitance the resulting structure will have. Another advantage is that the requirement for an LDD region is reduced. In addition to reducing the semiconductor processing required to provide remote contacts for source and drain regions, the present embodiment is advantageous in also reducing the contact region.

Figure 4:
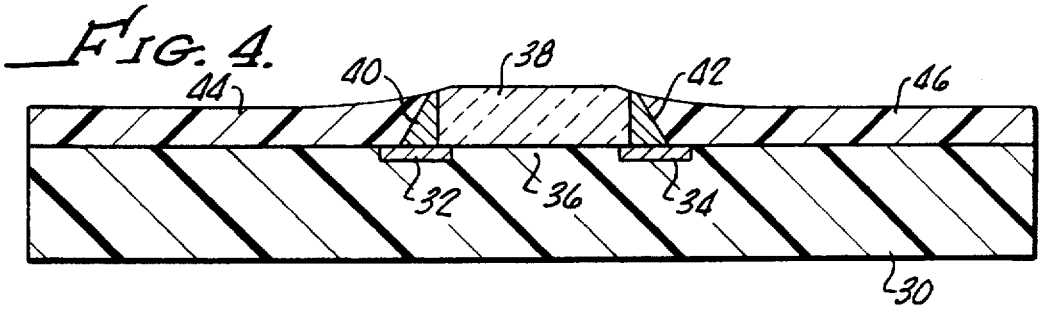
FIG. 4 is a fragmentary side section view of another FET structure after chemi-mechanical polishing in which the source and drain regions of FIG. 3 are shown as LDD regions.
Figure 5:
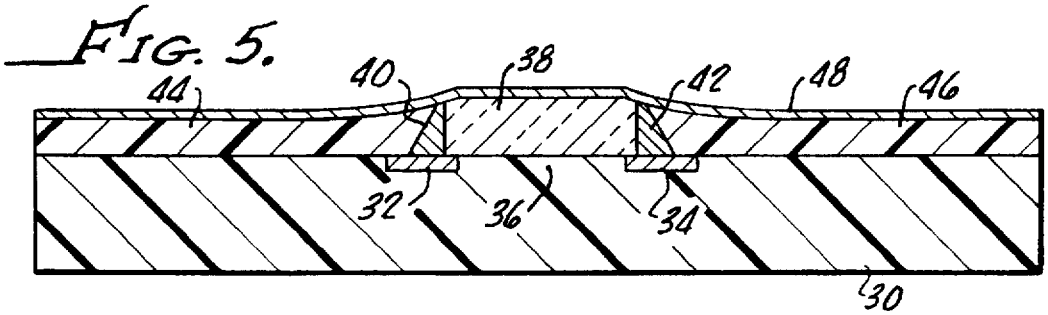
FIG. 5 is a fragmentary side section view of the structure of FIG. 4 after metal deposition.

In another preferred embodiment of the present invention, illustrated in FIGS. 4 and 5, remote contacts formed of a salicided polysilicon material are provided. A salicide can be formed over the polysilicon regions (patterned by the chemi-mechanical polishing) by subsequently depositing a layer of a refractory metal such as titanium, tungsten, cobalt or molybdenum, or a non-refractory metal such as platinum or palladium, which is capable of reacting with polysilicon upon exposure to elevated temperatures, for example, temperatures on the order of about 1,000° C. The salicide process further comprises removing excess metal from the surface of the transistor by etching, chemi-mechanical polishing, or any other desired method. It is presently regarded as particularly important to remove metal residues from the oxide spacers. Since the salicide forms only on the polysilicon areas of the transistor, salicide use is effective to provide contacts only within regions which are aligned with the source and drain areas of the transistor. A particular advantage of using salicide contacts is that, whereas the resistivity of polysilicon is on the order of 25 ohms per square centimeter, the resistivity of, for example, titanium silicide is on the order of about 2.5 ohms per square centimeter. Thus, contacts having significantly lower resistivity compared to polysilicon contacts themselves can be provided.

The embodiment of this invention incorporating salicide formation is illustrated in FIGS. 4 and 5. Referring to FIG. 4, a semiconductor substrate 30 contains LDD regions 32 and 34 which define a channel 36, over which is situated a gate 38. An oxide spacer 40 isolates gate 38 from LDD region 32, and an oxide spacer 42 isolates gate 22 from LDD region 34. A polysilicon layer 44, which has been polished following deposition, can be seen to be in contact with oxide spacer 40 and LDD region 32. A polysilicon layer 46 can similarly be seen to be in contact oxide spacer 42 and LDD region 34.

FIG. 5 contains the same elements as FIG. 4, and, in addition, a metal layer 48 which overlies polysilicon layer 44, oxide spacer 40, gate 38, oxide spacer 42, and polysilicon layer 46. As explained above, reaction of the metal layer with polysilicon of high, temperatures results in the production of a refractory metal silicide layer, a salicide. Salicide formation occurs only on the polysilicon, not on the oxide components. Thus, removal of metal from the oxide spacers and the gate results in the provision of low resistance salicide remote contacts for the LDD regions functioning as the source and drain for the semiconductor illustrated in FIGS. 4 and 5. It is, of course, possible to remove unwanted metal prior to salicide formation by chemi-mechanical polishing, or by etching, or by some other desired removal technique. However, it has been found that removal of the unwanted metal is facilitated by conversion of the metal deposited upon the polysilicon to a salicide prior to removal of the undesired metal.

In yet another preferred embodiment of the present invention, source and drain regions having varying concentrations of dopants dropping off in proximity to the channel region have been found desirable in reducing the risk of "punch-through" as the channel length of the FET is reduced. In order to achieve the desired variation in dopant concentration the polysilicon layer is deposited and polished, as in the first embodiment of this invention, prior to forming the source and drain regions by ion implantation. Since the polishing step typically results in a polysilicon layer having a slightly sloped shape, with the height increasing towards the gate structure, as shown in FIG. 4, a lower quantity of dopant will penetrate the increasing thickness of the polysilicon if the source and drain regions are formed by ion implantation after the polysilicon polishing step. The dopant concentration in the source and drain regions will then drop off in proximity to the channel region under the gate due to the increased thickness of the polished polysilicon proximate the gate. Thus, it is unnecessary to provide LDD regions prior to deposition of the polysilicon layer because ion implantation following polysilicon deposition can achieve the desired result. The above-described subsequent implantation method is applicable not only to polysilicon type contacts but also to salicide contacts as well.

The above-described embodiments of the present invention have the ultimate advantage of providing remote contacts which are extremely shallow and have very low capacitance, as well as the advantage of providing self-aligned contacts. Having thus described the invention, further modifications and adaptions of the invention will readily become apparent to those skilled in the art. Accordingly the present invention is not to be construed as limited to the various embodiments discussed herein and illustrated by the figures, but limited only by the claims recited below, and equivalents thereof.

We claim:

1. A method for providing shallow contacts for a semiconductor device comprising the steps of:

providing a semiconductor device comprising a semiconductor substrate, a gate, a source and drain regions, said gate being separated from said source and drain regions by means of insulating material;

depositing a polysilicon layer upon all of said gate, source and drain regions, insulating material, and exposed areas of said substrate;

chemi-mechanically polishing the resulting polysilicon layer to remove a portion of the polysilicon layer, a portion of said gate, and a portion of said insulating material; and said semiconductor device additionally comprising LDD regions in contact with said source and drain regions and in contact with said gate, said source and drain regions being isolated from said gate.

2. The method of claim 1, wherein said insulating material comprises silicon dioxide.

3. The method of claim 1, wherein said insulating material comprises silicon nitride.

4. The method of claim 1, wherein portions of said polysilicon layer remaining after polishing the resulting polysilicon layer to remove a portion of the polysilicon layer are converted to a salicide.

5. The method of claim 4 wherein said salicide is a refractory metal silicide.

6. The method of claim 5 wherein said salicide comprises a member selected from the group consisting of tungsten silicide, cobalt silicide, molybdenum silicide, and titanium silicide.

7. The method of claim 4 wherein said salicide has a resistivity of about 1 to 2.5 ohms per square centimeter.

8. The method of claim 4 wherein salicide conversion is accomplished by depositing a layer of a refractory metal upon said polysilicon layer and heating to a temperature of at least about 1,000° C.

9. The method of claim 8 wherein metal remaining after the salicide conversion is removed by chemi-mechanical polishing.

10. The method of claim 4, wherein the LDD regions in said semiconductor substrate are by ion implanting the LDD regions subsequent to converting the portions of said polysilicon layer remaining after polishing to said salicide.

11. The method of claim 1, wherein the LDD regions in said semiconductor substrate are by ion implanting the LDD regions subsequent to polishing the resulting polysilicon layer.

12. The method of claim 1, wherein the semiconductor device is a FET.

13. A method for providing shallow remote contacts on a gated semiconductor comprising:

depositing a polysilicon layer upon a gated semiconductor comprising a gate and insulating spacers;

chemi-mechanically polishing the resulting polysilicon layer to provide electrically isolated discrete areas of a polysilicon, said areas increasing in thickness towards the gate structure of said gated semiconductor;

said chemi-mechanical polishing removing portions of said polysilicon layer, said gate and said insulating spacers; and ion implanting dopant species in said areas.

14. The method of claim 13 which additionally comprises converting said areas into salicide areas.

15. The method of claim 14 wherein said salicide is a refractory metal silicide.

16. The method of claim 14 wherein said salicide is a member selected from the group consisting of tungsten silicide, cobalt silicide, molybdenum silicide, and titanium silicide.

* * * * *